United States Patent
Chang et al.

(10) Patent No.: US 9,093,365 B2
(45) Date of Patent: Jul. 28, 2015

(54) GAN-CONTAINING SEMICONDUCTOR STRUCTURE

(71) Applicant: National Chiao Tung University, Hsinchu (TW)

(72) Inventors: Yi Chang, Hsinchu County (TW); Yuen Yee Wong, Pahang (MY); Chi Feng Hsieh, Taipei (TW)

(73) Assignee: NATIONAL CHIAO TUNG UNIVERSITY, Hsinchu (TW)

( * ) Notice: Subject to any disclaimer, the term of this patent is extended or adjusted under 35 U.S.C. 154(b) by 0 days.

(21) Appl. No.: 14/190,382

(22) Filed: Feb. 26, 2014

(65) Prior Publication Data
US 2015/0102357 A1    Apr. 16, 2015

(30) Foreign Application Priority Data
Oct. 14, 2013    (TW) .............................. 102136932 A

(51) Int. Cl.
| | |
|---|---|
| H01L 21/20 | (2006.01) |
| H01L 29/20 | (2006.01) |
| H01L 21/02 | (2006.01) |
| H01L 29/778 | (2006.01) |
| H01L 29/872 | (2006.01) |

(52) U.S. Cl.
CPC ........ *H01L 29/2003* (2013.01); *H01L 21/0242* (2013.01); *H01L 21/0254* (2013.01); *H01L 21/0262* (2013.01); *H01L 21/02458* (2013.01); *H01L 21/02505* (2013.01); *H01L 29/778* (2013.01); *H01L 29/872* (2013.01)

(58) Field of Classification Search
USPC .......................................... 438/478
See application file for complete search history.

(56) References Cited

U.S. PATENT DOCUMENTS

| | | | |
|---|---|---|---|
| 6,533,874 B1 * | 3/2003 | Vaudo et al. .................. | 148/33.5 |
| 2014/0252366 A1 * | 9/2014 | Gao ................................ | 257/76 |

OTHER PUBLICATIONS

Chi Feng Hsieh, "Growth of AlGaN/GaN HEMT Structure on Sapphire Substrate for High Power Applications by MOCVD", Apr. 18, 2013, Oral Examination for Master Degree, National Chiao Tung University.

* cited by examiner

*Primary Examiner* — Marvin Payen
(74) *Attorney, Agent, or Firm* — Bacon & Thomas, PLLC

(57) ABSTRACT

A method for forming a GaN-containing semiconductor structure is provided. The method comprises a substrate is provided, a nucleation layer is formed above the substrate, a diffusion blocking layer is formed above the nucleation layer, a strain relief layer is formed above the diffusion blocking layer, and a semiconductor layer is formed above the strain relief layer, in which the diffusion blocking layer is deposited on the nucleation layer such that the diffusion blocking layer can prevent the impurities out-diffusion from the substrate.

2 Claims, 4 Drawing Sheets

GAN-CONTAINING SEMICONDUCTOR STRUCTURE

BACKGROUND OF THE INVENTION

1. Field of the Invention

The present invention relates to a GaN-containing semiconductor structure, more particularly to a GaN-containing semiconductor structure for GaN electronic device and the manufacturing method thereof.

2. Description of the Prior Art

Generally speaking, as for the manufacturing process of GaN-containing electronic device, high quality aluminum nitride (AlN) buffer layer is required to reduce the current leakage problem of electronic device. The AlN buffer layer can prevent the oxygen out-diffusion from the substrate, particularly from the sapphire substrate. In addition, the AlN buffer layer can also prevent the silicon (Si) diffusing from the silicon substrate or silicon carbide substrate into the GaN material.

However, due to the rough surface of AlN buffer and the large lattice constant mismatch between AlN and GaN material, GaN layer grown on AlN buffer will also suffer from having rough surface morphology.

In the prior art, during the growth process of AlN, the ammonia (NH3) is adjusted by entering the growth chamber periodically. The diffusion distance of aluminum atom on material surface can be increased by the method, and the surface of formed AlN will be a smooth surface. However, this method is complex and the growth control of AlN is difficult. In addition, this method will also reduce the growth rate of AlN. There is another problem that the quick and rapid on/off operation will cause the failure of the mass flow controller of metal organic chemical vapor deposition (MOCVD) or the mechanical shutter of molecular beam epitaxy (MBE).

In another prior art, other approaches comprise using extreme growth conditions in the MOCVD such as a very high growth temperature (>1200° C.) or a very low group V to group III gases flow ratio (V/III ratio, <10). However, most of the growth reactors cannot provide such high temperature and low V/III ratio. The extreme growth parameters may beyond the optimized range of growth conditions designed for most of the MOCVD reactors. As a consequence, the gas flow dynamics in the reactor will be significantly affected.

Sometime, an AlGaN buffer layer is also used to prevent the out-diffusion problem. However, it may not as effective as the AlN, because the AlGaN has lower bandgap. Thus, the impurity such as oxygen atom in this material will tend to form shallow donor and thus reduce the resistivity of the material. Its capability to trap impurities is also poorer as compared to AlN. Thus, the impurities may still diffuse into the GaN layer.

SUMMARY OF THE INVENTION

According to the shortcoming of known art, the main purpose of the present invention is to disclose a GaN-containing semiconductor structure with composite buffer layer, high resistive and smooth surface morphology.

Another purpose of the present invention is to utilize low leakage current electronic device process to form a GaN-containing semiconductor structure.

According to the abovementioned purposes, a method for forming a GaN-containing semiconductor structure is provided by the present invention. The method includes a substrate is provided, a nucleation layer is formed above the substrate, a diffusion blocking layer is formed above the nucleation layer, a strain relief layer is formed above the diffusion blocking layer, and a semiconductor layer is formed above the strain relief layer, in which the diffusion blocking layer is deposited on the nucleation layer such that the diffusion blocking layer can prevent the impurities out-diffusion from the substrate.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

Figure 1:
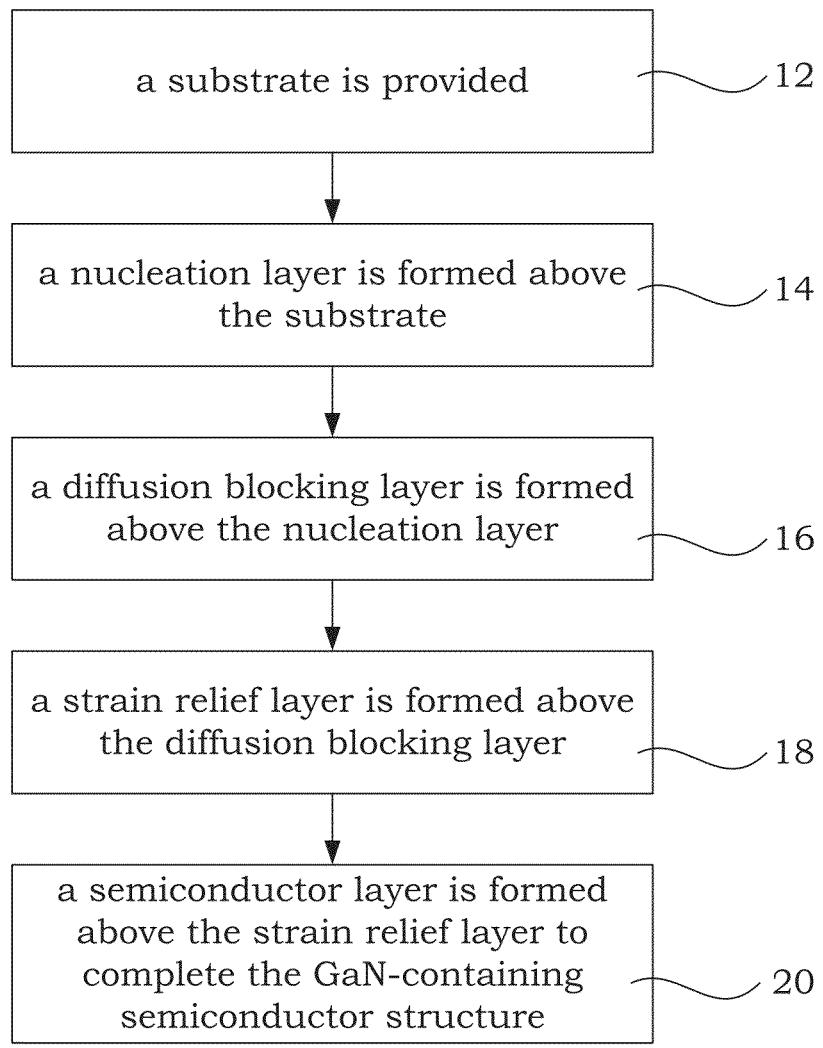
FIG. 1 illustrates the block flow diagram for forming the GaN-containing semiconductor structure according to the technology disclosed by the present invention.

Please refer to FIG. 1. FIG. 1 illustrates the block flow diagram for forming the GaN-containing semiconductor structure according to the technology disclosed by the present invention. In FIG. 1, a substrate is provided in Step 12 first. A nucleation layer is formed above the substrate in Step 14. A diffusion blocking layer is formed above the nucleation layer in Step 16. Then, a strain relief layer is formed above the diffusion blocking layer in Step 18. Finally, a semiconductor layer is formed above the strain relief layer in Step 20 to complete the GaN-containing semiconductor structure. The GaN-containing semiconductor structure is suitable for high electron mobility transistor (HEMT) or Schottky barrier diode (SBD). In addition, the metal organic chemical vapor deposition (MOCVD) is used as the deposition method in the embodiment.

Figure 2:
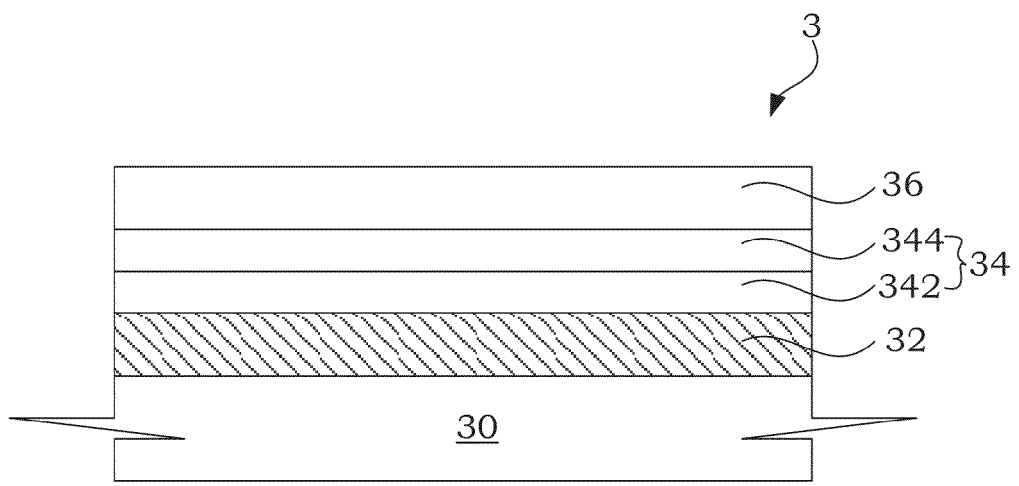
FIG. 2 illustrates the cross-sectional view of GaN-containing semiconductor structure according to the technology disclosed by the present invention.

Then, please refer to FIG. 2. FIG. 2 illustrates the cross-sectional view of GaN-containing semiconductor structure according to the technology disclosed by the present invention. In FIG. 2, the GaN-containing semiconductor structure 3 comprises a substrate 30, a nucleation layer 32, a buffer layer 34 and a GaN semiconductor layer 36 from bottom to top.

In the present invention, the substrate 30 may be the silicon substrate, the silicon carbide substrate or the sapphire substrate. The nucleation layer 32 is grown on the substrate 30 by the metal organic chemical vapor deposition (MOCVD). In the embodiment, the deposition temperature of nucleation layer 32 is from 500° C. to 800° C. and the deposition thickness is smaller than 50 nm. In addition, the nucleation layer 32 may be AlN or AlGaN.

Please refer to FIG. 2 again. In the present invention, the buffer layer 34 comprises a diffusion blocking layer 342 and a strain relief layer 344, in which the diffusion blocking layer 342 is deposited on the nucleation layer 32 and the strain relief layer 344 is deposited on the diffusion blocking layer 342. In an embodiment of the present invention, the deposition temperature of the diffusion blocking layer 342 on the nucleation layer 32 is from 950° C. to 1200° C., and the deposition thickness is from 100 nm to 2000 nm. In this embodiment, the diffusion blocking layer 342 may be AlN, and single AlGaN layer or AlN and multiple AlGaN.

It has to stated that the III-nitride layers are deposited on the substrate 30 at high temperature (up to 1200° C.). The oxygen or silicon out-diffusion phenomenon will be occurred at this high temperature condition. If the substrate 30 is the sapphire substrate, due to the sapphire substrate 30 includes Al2O3, the oxygen will diffuse from the sapphire substrate into the GaN semiconductor layer 36, while the silicon diffuses from the silicon substrate or the silicon carbide substrate into the GaN semiconductor layer 36. Then, the diffusion blocking layer 342 formed in the present invention can prevent the impurities, such as oxygen or silicon diffusing from the substrate 30 into the GaN semiconductor layer 36, so as to increase the reliability of the semiconductor structure.

In FIG. 2, the strain relief layer 344 is deposited on the diffusion blocking layer 342 at low temperature, such as from 450° C. to 600° C., and the better deposition temperature is 500° C. In the embodiment, the strain relief layer 344 is GaN, the deposition thickness on the diffusion blocking layer 342 is from 30 nm to 100 nm.

Then, due to the deposition temperature of the GaN semiconductor layer 344 is lower, the GaN semiconductor layer 344 can be considered as the defective layer. When the GaN semiconductor layer 36 is deposited, due to higher growth temperature is required, then the growth temperature is raised to about 1050° C. When the growth temperature is increased continuously, the recrystallization of the previous formed GaN strain relief layer 344 will be started, and the strain of lattice constant mismatch between AlN and GaN will be released, then the GaN semiconductor layer 36 can obtain high quality and smooth surface. Because the diffusion blocking layer 342 traps or blocks the impurities diffused from the substrate 30 to the GaN semiconductor layer 36, so that the GaN semiconductor layer 36 has high resistive. In the embodiment, the deposition temperature of the GaN semiconductor layer 36 is from 950° C. to 1200° C., and the deposition thickness is 1 um to 5 um.

Figure 3:
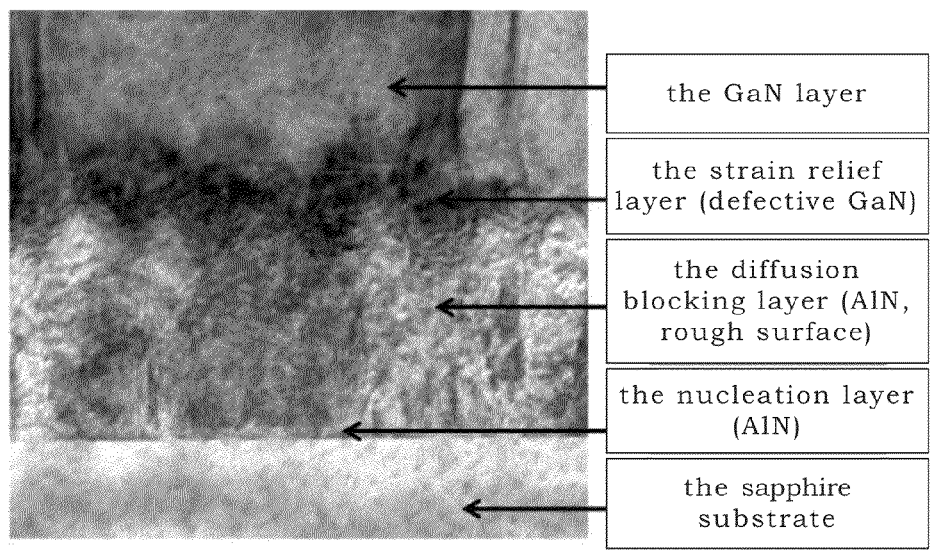
FIG. 3 illustrates the transmission electron microscope (TEM) diagram of GaN-containing semiconductor structure according to the technology disclosed by the present invention.

Then, please refer to FIG. 3. FIG. 3 illustrates the transmission electron microscope (TEM) diagram of GaN-containing semiconductor structure according to the technology disclosed by the present invention. In FIG. 3, it is obviously shown that the strain relief layer 344 of the buffer layer 34 has a structure with multiple defects.

Figure 4A:
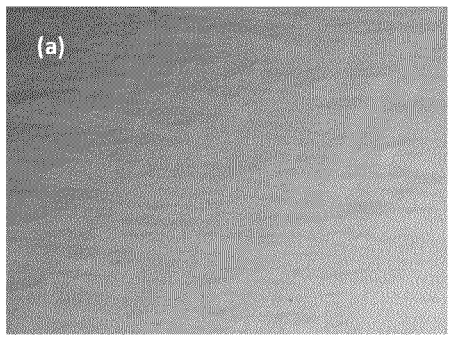
FIG. 4(a) and FIG. 4(b) illustrates the optical image diagram of the GaN growth structure with the diffusion blocking layer and the strain relief layer as the buffer layers as well as the GaN growth structure with a single buffer layer according to the technology disclosed by the present invention.
Figure 4B:
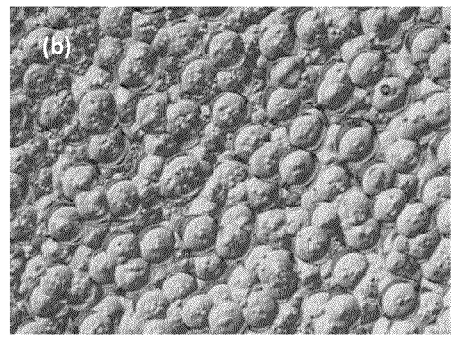

Then, please refer to FIG. 4(a) and FIG. 4(b). FIG. 4(a) and FIG. 4(b) illustrates the optical image diagram of the GaN growth structure with the diffusion blocking layer and the strain relief layer as the buffer layers as well as the GaN growth structure with a single buffer layer. FIG. 4(a) shows GaN growth structure with the diffusion blocking layer 342 and the strain relief layer 344 as the buffer layer 34. FIG. 4(b) shows the GaN growth structure with a single AlN buffer layer. It is obvious that FIG. 4(a) shows smooth surface of GaN growth structure and FIG. 4(b) shows rough surface of GaN growth structure.

Therefore, according to the abovementioned description, the high resistive GaN-containing semiconductor structure for the GaN electronic device includes a buffer layer 34 composed of the diffusion blocking layer 342 and the strain relief layer 344. The material of diffusion blocking layer 342 may be one single AlN layer, or one single AlN layer with one single AlGaN layer, or one single AlN layer with multiple AlGaN layers. The material of strain relief layer 344 is the GaN grown at low temperature. Although the strain relief layer 344 grown at low temperature has many defects, it can mitigate the strain of lattice constant mismatch between AlN and GaN. When the temperature of the substrate 30 is increased, the strain relief layer 344 grown at low temperature will recrystallize. The recrystallization will increase the quality of GaN layer 36 effectively. The GaN material with smooth surface can be grown on the diffusion blocking layer 342 with rough surface by this growth mode. Meantime, due to the combination of the diffusion blocking layer, the impurities in the GaN can be reduced to minimum, in order to increase the material resistive significantly. By using this high resistive GaN material as the buffer layer for high electron mobility transistor or Schottky barrier diode, the leakage current of electronic device can be reduced effectively, and the power conversion efficiency of device can be increased.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which this invention pertains.

What is claimed is:

1. A method for forming a GaN-containing semiconductor structure by using metal-organic chemical vapor deposition (MOCVD), comprising:
   providing a substrate;
   providing a nucleation layer on the substrate by using metal-organic chemical vapor deposition (MOCVD), wherein a forming temperature of the nucleation layer is from 500° C. to 800° C.;
   providing a diffusion blocking layer on the nucleation layer by using metal-organic chemical vapor deposition (MOCVD), wherein the forming temperature of the diffusion blocking layer is from 950° C. to 1200° C.;
   providing a strain relief layer on the diffusion blocking layer by using metal-organic chemical vapor deposition (MOCVD), wherein the forming temperature of the strain relief layer is from 450° C. to 600° C.; and
   providing a semiconductor layer on the strain relief layer by using metal-organic chemical vapor deposition (MOCVD), wherein the forming temperature of the semiconductor layer is from 950° C. to 1200° C.

2. A GaN-containing semiconductor structure formed by using metal-organic chemical vapor deposition (MOCVD), comprising:
   a substrate;
   a nucleation layer on the substrate, wherein the nucleation layer is AlN layer;
   a diffusion blocking layer on the nucleation layer, wherein the diffusion blocking layer is selected from the group consisting of a single AlN layer, the single AlN layer with a single AlGaN layer, the single AlN layer with multiple AlGaN layers, wherein the forming temperature of the diffusion blocking layer is from 950° C. to 1200° C.;
   a strain relief layer on the diffusion blocking layer, wherein the strain relief layer is GaN, and a thickness of the strain relief layer is from 30 nm to 100 nm, the forming temperature of the strain relief layer is from 450° C. to 600° C.; and a semiconductor layer on the strain relief layer, wherein the forming temperature of the semiconductor layer is from 950° C. to 1200° C.

* * * * *